(12) United States Patent
Rajaee et al.

(10) Patent No.: US 8,779,957 B2
(45) Date of Patent: Jul. 15, 2014

(54) LOW DISTORTION FEED-FORWARD DELTA-SIGMA MODULATOR

(75) Inventors: Omid Rajaee, San Diego, CA (US); Liang Dai, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 37 days.

(21) Appl. No.: 13/565,715

(22) Filed: Aug. 2, 2012

(65) Prior Publication Data

US 2014/0035769 A1 Feb. 6, 2014

(51) Int. Cl.
*H03M 3/02* (2006.01)
*H03M 3/00* (2006.01)

(52) U.S. Cl.
CPC ..................... *H03M 3/452* (2013.01)
USPC ......................................................... 341/143

(58) Field of Classification Search
CPC ..................................................... H03M 3/452
USPC .......................................................... 341/143
See application file for complete search history.

(56) References Cited

U.S. PATENT DOCUMENTS

| | | | |
|---|---|---|---|
| 5,331,222 A | 7/1994 | Lin et al. | |
| 5,341,050 A | 8/1994 | Mellissinos et al. | |
| 5,426,393 A | 6/1995 | Sevastopoulos | |
| 5,634,202 A | 5/1997 | Connell et al. | |
| 5,680,072 A | 10/1997 | Vulih et al. | |
| 6,359,579 B1 | 3/2002 | Chiang | |
| 6,653,967 B2 | 11/2003 | Hamashita | |
| 6,667,843 B2 | 12/2003 | Norman et al. | |
| 6,744,392 B2 | 6/2004 | Melanson | |
| 6,873,276 B2 | 3/2005 | Yang et al. | |
| 6,940,436 B2 | 9/2005 | Hezar et al. | |
| 7,038,532 B1 | 5/2006 | Bocko et al. | |
| 7,098,730 B1 | 8/2006 | Shui | |
| 7,119,608 B2 * | 10/2006 | Doerrer | 327/552 |
| 7,167,121 B2 | 1/2007 | Carreau et al. | |
| 7,379,002 B1 | 5/2008 | Zhixu et al. | |
| 7,626,525 B2 | 12/2009 | Zhou et al. | |
| 7,956,780 B2 * | 6/2011 | Doerrer | 341/143 |

(Continued)

FOREIGN PATENT DOCUMENTS

| | | |
|---|---|---|
| DE | 3401516 | 7/1985 |
| JP | 2138609 A | 5/1990 |

(Continued)

OTHER PUBLICATIONS

Gharbiya et al., On The Implementation of Input-Feedforward Delta-Sigma Modulators IEEE Transactions on Circuits and Systems-II: Express Briefs, vol. 53, No. 6, Jun. 2006, pp. 453-457.*

(Continued)

*Primary Examiner* — Howard Williams
(74) *Attorney, Agent, or Firm* — Paul S. Holdaway

(57) ABSTRACT

A low distortion feed forward delta sigma modulator includes a first adder configured to receive a feedback signal and an input signal. The modulator also includes a first integrator configured to receive an output from the first adder, and a second integrator configured to receive an output from the first integrator. The modulator further includes a second adder configured to receive a second integrated path from the second integrator, a first integrating path from the first integrator and a first summing path from the input signal. The modulator also has a last integrator configured to receive an output from the second adder.

12 Claims, 10 Drawing Sheets

(56) References Cited

U.S. PATENT DOCUMENTS

| | | | |
|---|---|---|---|
| 8,169,351 | B2 | 5/2012 | Lee |
| 2005/0088327 | A1 | 4/2005 | Yokoyama et al. |
| 2006/0038708 | A1* | 2/2006 | Luh et al. .................. 341/143 |
| 2009/0051421 | A1 | 2/2009 | Mathe |
| 2009/0066549 | A1 | 3/2009 | Thomsen et al. |
| 2009/0115507 | A1 | 5/2009 | Cho |

FOREIGN PATENT DOCUMENTS

| | | |
|---|---|---|
| JP | 8070251 A | 3/1996 |
| JP | 10190468 A | 7/1998 |
| JP | 2000022500 A | 1/2000 |
| JP | 2001358591 A | 12/2001 |
| JP | 2005136450 A | 5/2005 |
| JP | 2007049745 A | 2/2007 |
| KR | 19970007874 | 5/1997 |
| KR | 20060129544 A | 12/2006 |

OTHER PUBLICATIONS

Young, Brian L., ECE 627 Project: Design of a High-Speed Delta-Sigma A/D Converter, Oregon State University, Jun. 6, 2008.*

San et al., Second-Order $\Delta\Sigma$AD Modulator with Novel Feedforward Architecture, 50th Midwest Symposium on Circuits and Systems, 2007. MWSCAS 2007, Aug. 5-8, 2007, IEEE, pp. 148-151.*

Nam et al., A Low-Voltage Low-Power Sigma-Delta Modulator for Broadband Analog-to-Digital Conversion, IEEE Journal of Solid-State Circuits, Sep. 2005, vol. 40, No. 9, pp. 1855-1864.

Silva J., et al., Wideband low-distortion delta-sigma ADC topology, Electronics Letters, Jun. 7, 2001, vol. 37, No. 12, pp. 737-738.

International Search Report and Written Opinion—PCT/US2013/052748—ISA/EPO—Oct. 30, 2013.

Xu Y "A Wideband High Dynamic Range Continuous-Time Sigma-Delta ADC for Wireless Applications", Aug. 31, 2010, XP055084848, Retrieved from the Internet: URL:http://urn.kb.se/resolve?urn=urn:nbn:se:kth:diva-24293 [retrieved on Oct. 22, 2013].

* cited by examiner

LOW DISTORTION FEED-FORWARD DELTA-SIGMA MODULATOR

CROSS-REFERENCE TO RELATED APPLICATION

This is application is related to co-pending patent application Ser. No. 12/105,545 filed Apr. 18, 2008, in the name of Mathe, the disclosure of which is expressly incorporated by reference herein in its entirety

TECHNICAL FIELD

The present disclosure relates generally to delta-sigma modulators. More specifically, the disclosure relates to reducing the complexity of delta-sigma modulators.

BACKGROUND

Some electronic devices include switched capacitor circuits implementing both integration and signal-summing functions. In particular, sigma-delta modulators or converters may use switched capacitor integrators followed by switched capacitor summers. Sigma-delta modulators may be employed, for example, to convert an intermediate frequency (IF) signal to a baseband frequency signal, in order to meet dynamic range requirements for digital signal processing, and to provide improved adaptability and programmability to receiver circuitry. In these and other applications, the advantages of sigma-delta modulators include high dynamic range, which often helps to distinguish a small desired signal from blockers and interferers. Sigma-delta modulators shape the quantization noise out-of-band, and allow combining decimation filtering with selective digital filtering and IF mixing to attenuate both the quantization noise and neighboring blockers.

In addition, the ability to select different sampling rates in the sigma-delta modulator architecture allows a single device to be adapted to different specifications, for example, the specifications imposed by multiple RF standards. Moreover, the use of higher sampling rates and complex digital signal processing allow sigma-delta converters to exhibit relatively low sensitivity to interfering analog signals.

Size, weight, power consumption, speed, and production costs loom large in designing electronic equipment, and especially portable battery-operated electronic equipment such as mobile wireless devices. Therefore, there is a need in the art to reduce the power consumption of electronic equipment, including sigma-delta modulators and other devices that include integrators and summers. There is also a need in the art to decrease size and weight of electronic equipment, including sigma-delta modulators and other devices that include integrators and summers. There is a further need in the art to lower the cost of manufacturing electronic equipment, including sigma-delta modulators and other devices that include integrators and summers. There is still another need in the art to increase the operating speed of electronic equipment, including sigma-delta modulators and other devices that include integrators and summers.

SUMMARY

In accordance with an aspect of the present disclosure, a low distortion feed forward delta sigma modulator is presented. The low distortion feed forward delta sigma modulator includes a first adder configured to receive a feedback signal and an input signal. The low distortion feed forward delta sigma modulator also includes a first integrator configured to receive an output from the first adder, and a second integrator configured to receive an output from the first integrator. The low distortion feed forward delta sigma modulator still further includes a second adder configured to receive a second integrating path from the second integrator, a first integrating path from the first integrator and a first summing path from the input signal. The low distortion feed forward delta sigma modulator also has a last integrator configured to receive an output from the second adder. The low distortion feed forward delta sigma modulator can further includes a quantizer configured to feed back output to the first adder and also to output a quantized result from the low distortion feed forward delta sigma modulator.

In accordance with another aspect of the present disclosure, a method for processing signals in a low distortion feed forward delta sigma modulator is presented. The method includes receiving a feedback signal and an input signal at a first adder. The method also includes receiving an output from the first adder at a first integrator. The method further includes receiving an output from the first integrator at a second integrator. The method still further includes receiving a second integrating path from the second integrator, a first integrating path from the first integrator, and a first summing path from the input signal at a second adder. The method still further includes receiving an output from the second adder at a last integrator. The method also includes feeding back output to the first adder and outputting a quantized result from the low distortion feed forward delta sigma modulator via a quantizer.

In accordance with yet another aspect of the present disclosure, a low distortion feed forward delta sigma modulator is presented. The low distortion feed forward delta sigma modulator includes first means for adding a feedback signal and an input signal. The low distortion feed forward delta sigma modulator also includes first means for integrating an output from the first means for adding. The low distortion feed forward delta sigma modulator further includes second means for integrating an output from the first means for integrating. The low distortion feed forward delta sigma modulator still further includes second means for adding a second integrating path from the second means for integrating, a first integrating path from the first means for integrating and a first summing path from the input signal. The low distortion feed forward delta sigma modulator still further includes last means for integrating an output from the second means for adding. The low distortion feed forward delta sigma modulator also includes means for feeding back an output to the first means for adding and for outputting a quantized result from the low distortion feed forward delta sigma modulator.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

According to aspects of the present disclosure, the feed-forward gain of a delta-sigma modulator is changed to reduce the complexity of the feed-forward delta-sigma modulator by reducing the input loading of the adder and the output loading of the integrators. That is, the proposed solutions reduce the complexity of an Nth order feed-forward delta-sigma modulator to that of an (N−1)th order delta-sigma modulator without degrading performance, while using a less complex design.

Feed-forward low distortion architectures are widely used in delta-sigma modulators because of the architecture's simplicity. These feed-forward low distortion architectures may use an adder at the input of a quantizer with a dedicated amplifier.

Figure 1:
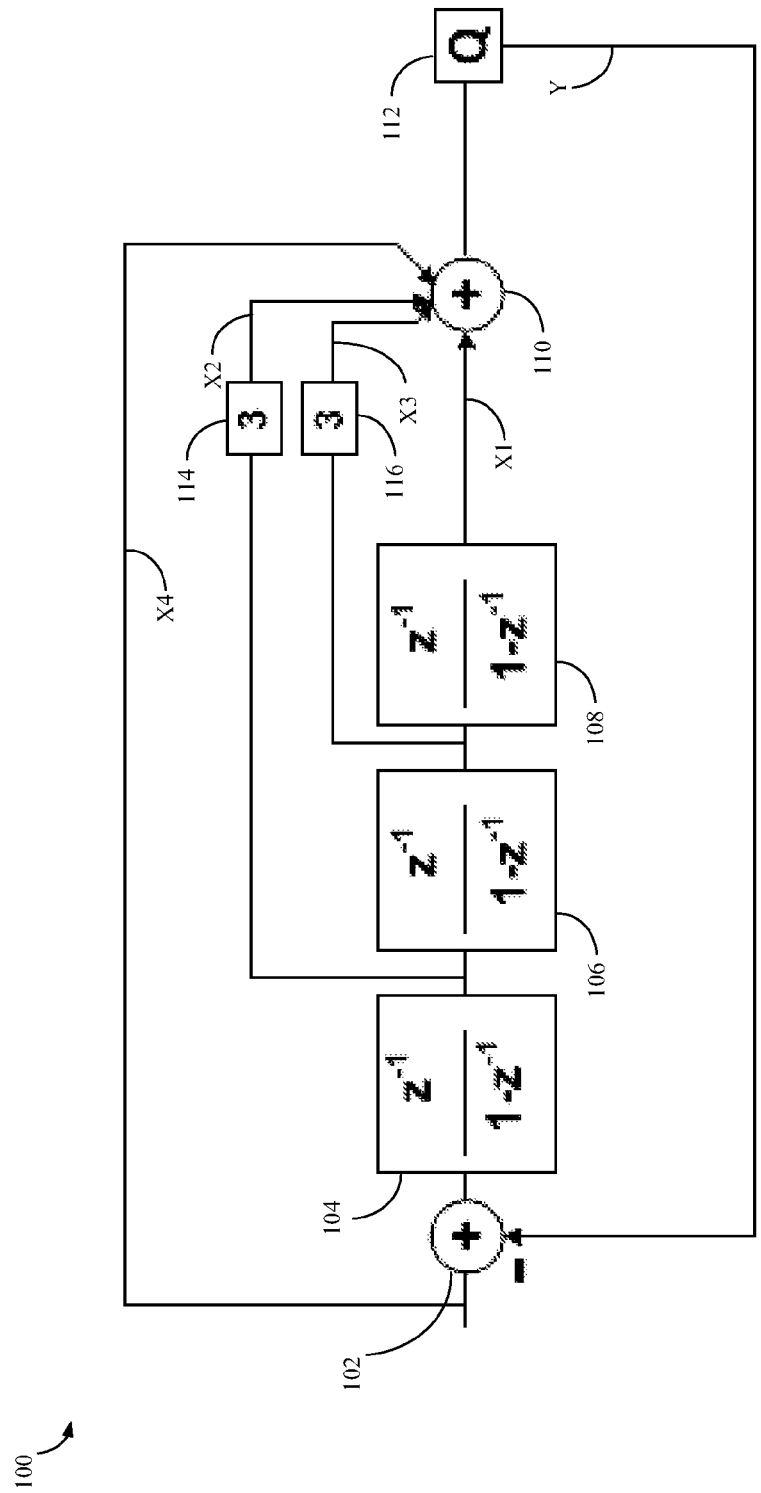
FIGS. 1-2 illustrate prior art feed-forward delta-sigma modulators.

FIG. 1 illustrates a conventional delta-sigma modulator 100 using a feed-forward low distortion architecture. As illustrated in FIG. 1, the conventional delta-sigma modulator 100 includes a first adder 102, a first integrator 104, a second integrator 106, a third integrator 108, a second adder 110, a quantizer 112, a first scaled feed forward path 114, and a second scaled feed forward path 116. Each integrator is configured to integrate an analog signal. It should be noted that $z^{-1}$ is a delay.

In operation, the conventional delta-sigma modulator 100 generates an output Y by adding the X1, X2, X3, and X4 signals. It should be noted that the numeral "3" illustrated in the first scaled feed forward path 114 and the second scaled feed forward path 116 refers to the gain. That is, as illustrated in FIG. 1, the first scaled feed forward path 114 and the second scaled feed forward path 116 increase the signal by a gain of 3.

In an effort to decrease power consumption and area, some systems have merged the second adder 110 and the third integrator 108 of the conventional delta-sigma modulator 100. The merger of the second adder 110 and third integrator 108 decreases the number of amplifiers. The merger of the second adder 110 and the third integrator 108 is discussed in co-pending patent application Ser. No. 12/105,545 filed Apr. 18, 2008, in the name of Mathe, the disclosure of which is expressly incorporated herein by reference in its entirety.

Figure 2:
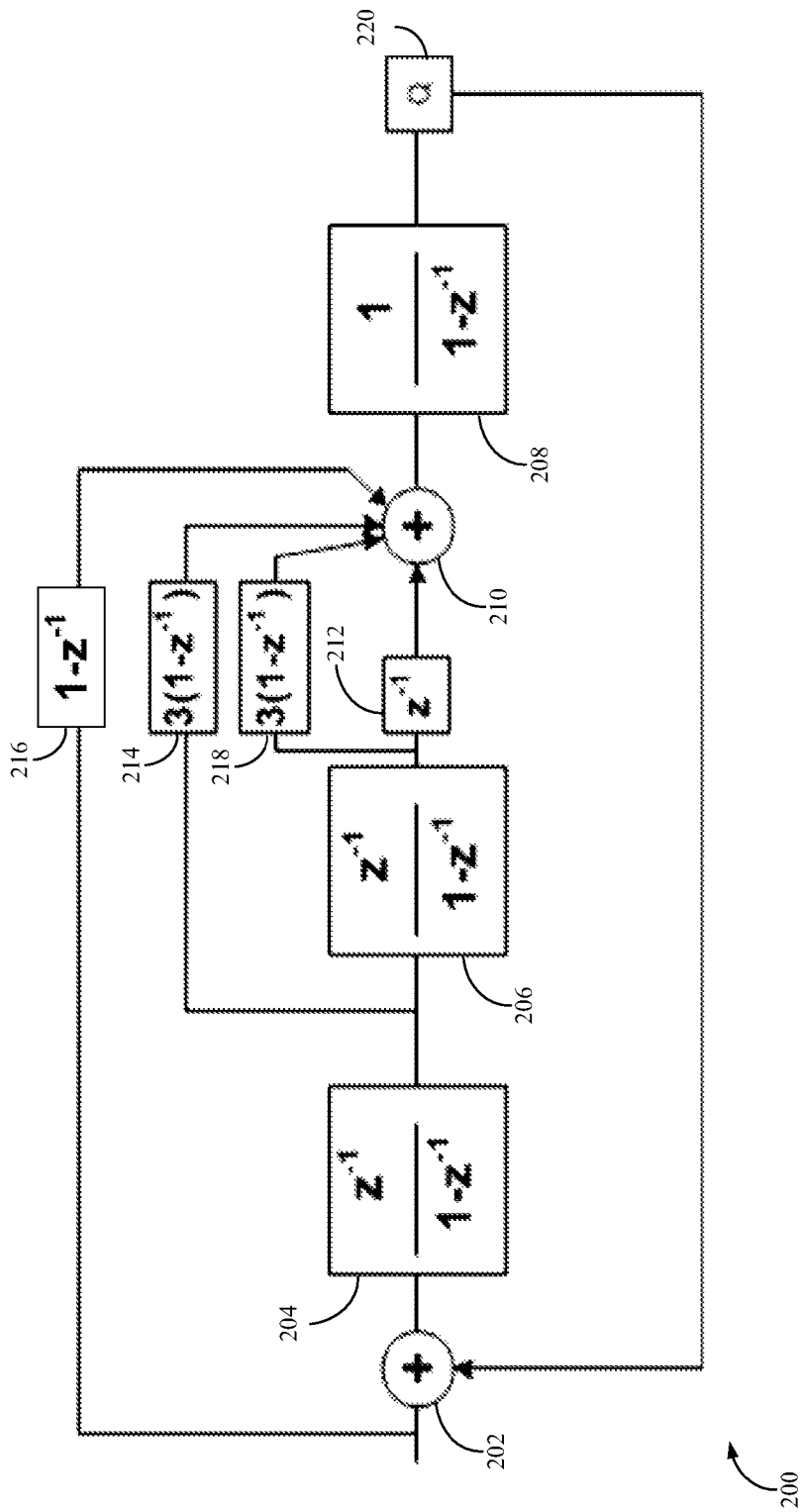

FIG. 2 illustrates a conventional merged delta-sigma modulator 200 using a feed-forward low distortion architecture comprising a merged adder and integrator. As illustrated in FIG. 2, the conventional merged delta-sigma modulator 200 includes a first adder 202, a first integrator 204, a second integrator 206, a third integrator 208, a second adder 210, a quantizer 220, a first scaled feed forward path 212, a second scaled feed forward path 214, a third scaled feed forward path 216, and a fourth scaled feed forward path 218.

In comparison to the conventional delta-sigma modulator 100 of FIG. 1, the conventional merged delta-sigma modulator 200 of FIG. 2 has a decreased number of amplifiers resulting in a decrease of power and area.

A draw back of the conventional feed-forward low distortion architecture (e.g., conventional merged delta-sigma modulator and conventional delta-sigma modulator) is the exponential increase of the input loading of the adder and the output loading of the integrators with the order of the loop filter. For example, if the weight of each pass is one, in a third order feed-forward low distortion architecture (see FIG. 2), the weight of the passes equals eight. In a fourth order feed-forward low distortion architecture (see FIG. 4A), the weight of the passes is sixteen. The pass refers to the transmission of a signal from an integrator to the adder. An increase in the weighted sum of passes results in a degradation of the feedback factor.

The feedback factor of the last integrator is inversely proportional to the weighted sum of feed forward paths of integrators and an input signal connected to the input of the second adder. For example, if the weighted sum of X1, X2, X3 and X4 is reduced by half, the feedback factor is increased by a factor of approximately two. A higher feedback factor results in a lower power consumption of a last integrator and also provides for greater accuracy. Thus, it is desirable to reduce the complexity of the feed-forward delta-sigma modulator to reduce the input loading of the adder and the output loading of the integrators.

According to aspects of the present disclosure, the feed-forward gain of a delta-sigma modulator is changed to reduce the complexity of the feed-forward delta-sigma modulator by reducing the input loading of the adder and the output loading of the integrators. That is, the proposed aspects reduce the complexity of an Nth order feed-forward delta-sigma modulator to that of an (N−1)th order delta-sigma modulator without degrading the performance while using a less complex design.

Figure 3A:
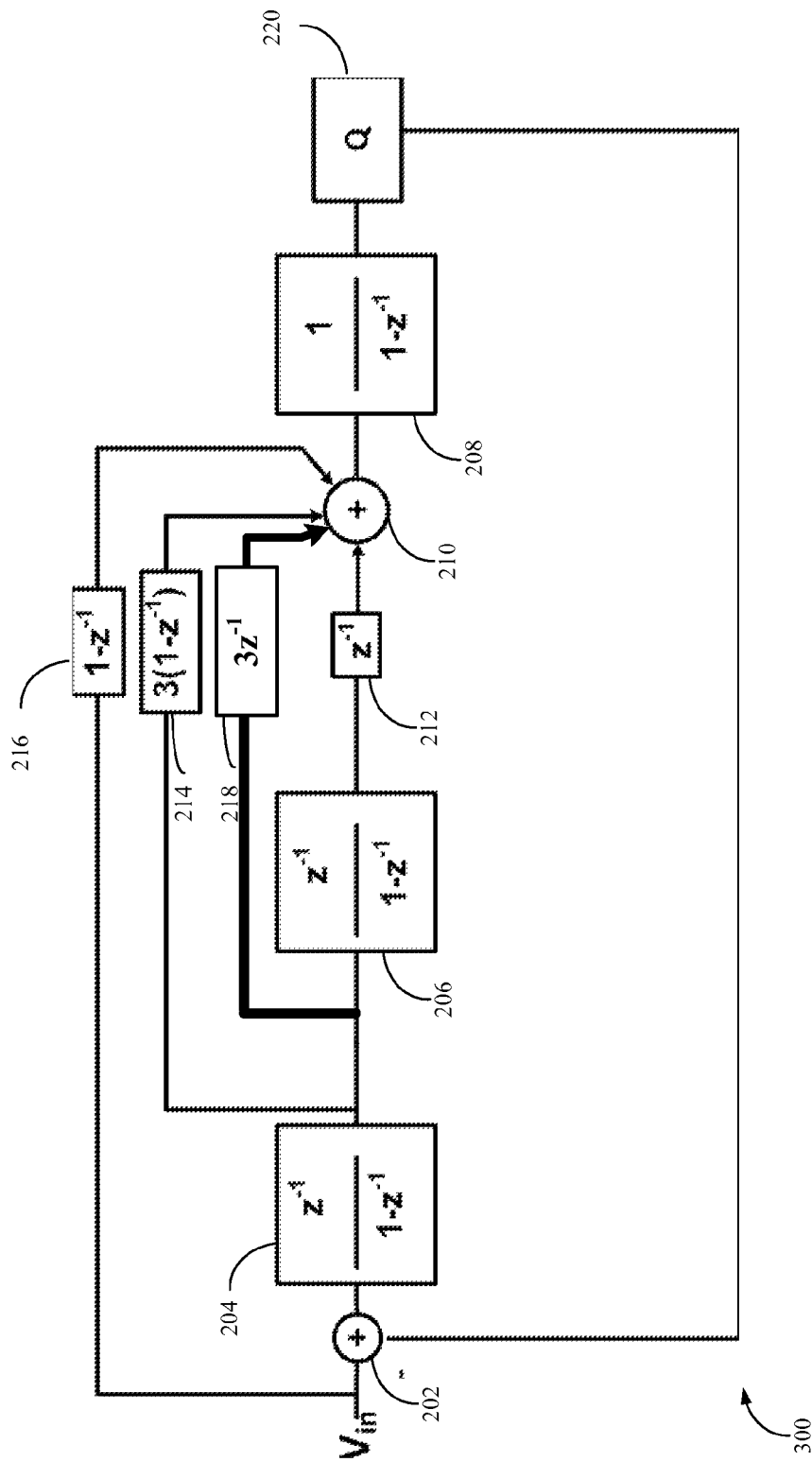
FIGS. 3A-3B illustrate feed-forward delta-sigma modulator according to aspects of the present disclosure.

FIG. 3A illustrates a delta-sigma modulator 300 using a feed-forward low distortion architecture, according to an aspect of the present disclosure. As illustrated in FIG. 3A, the delta-sigma modulator 300 includes some aspects that are similar to a conventional merged delta-sigma modulator 200. In this example, the delta-sigma modulator 300 includes a first adder 202, a first integrator 204, a second integrator 206, a third integrator 208, a second adder 210, a quantizer 220, a first scaled feed forward path 212, a second scaled feed forward path 214, a third scaled feed forward path 216, and a fourth scaled feed forward path 218.

According to the present aspect, the source of the fourth scaled feed forward path 218 is moved to an output of a previous integrator, i.e., the first integrator 204. Furthermore, the form of the fourth scaled feed forward path 218 is modified from $3(1-z^{-1})$ to $3z^{-1}$ (e.g., summing to delayed integrating). That is, the amplification/delay of the moved scaled feed forward path is multiplied by the inverse of the transfer function of the integrator of the previous stage. For example, in moving the fourth scaled feed forward path 218, the amplification/delay ($3(1-z^{-1})$) is multiplied by the inverse of the transfer function of the second integrator 206. After being moved to the previous stage, the fourth scaled feed forward path 218 is merged with the second scaled feed forward path 214.

It should be noted that after moving a scaled feed forward path, such as the fourth scaled feed forward path 218, the transfer function of the delta-sigma modulator remains the same.

Figure 3B:
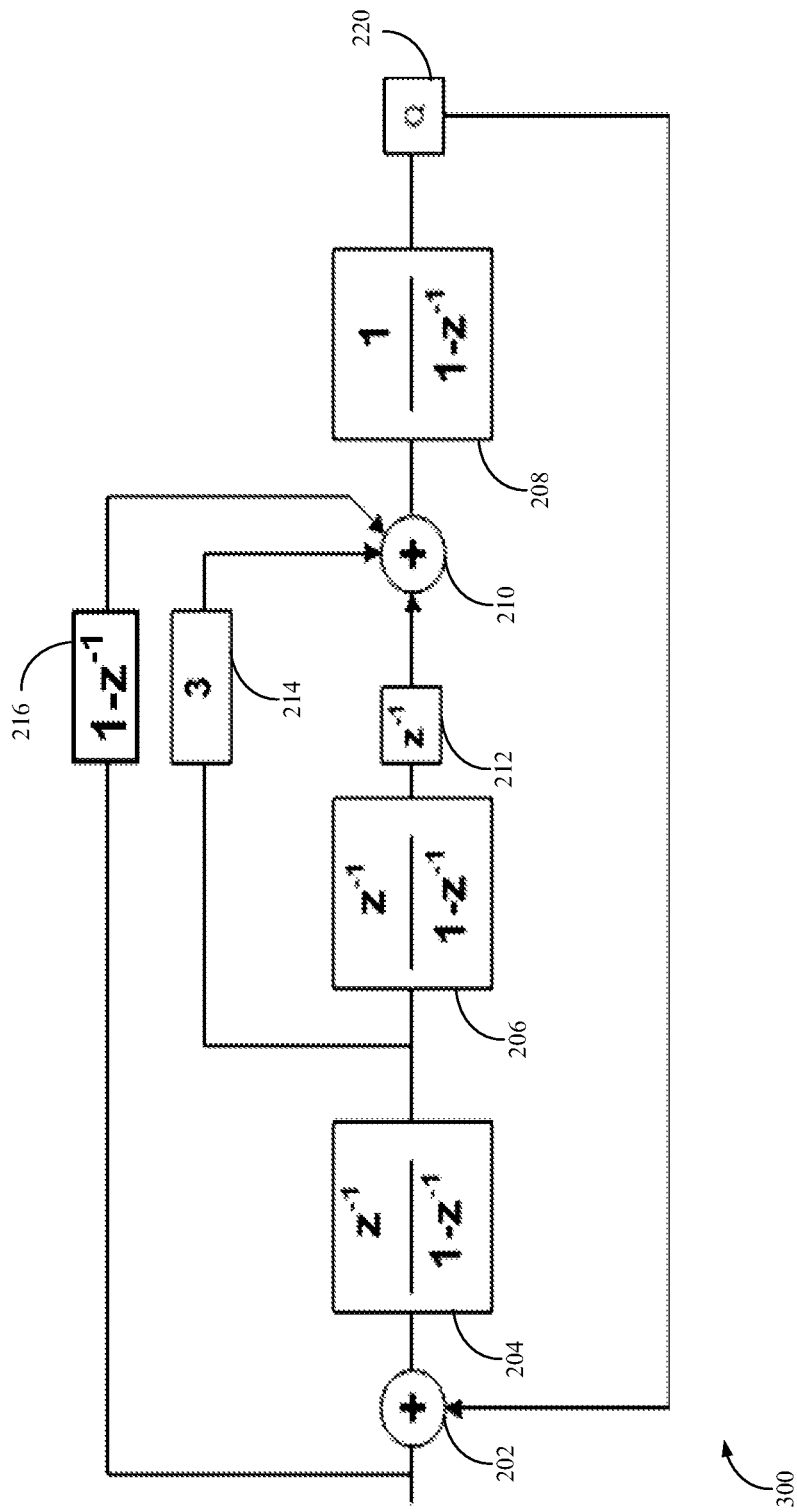

FIG. 3B illustrates a delta-sigma modulator 300 using feed-forward low distortion architecture according to another aspect of the present disclosure. As illustrated in FIG. 3B, the fourth scaled feed forward path 218 is merged with the second scaled feed forward path 214 and the amplification/delay of the second scaled feed forward path 214 has been modified as a result of the merging.

The delta-sigma modulator 300 shown in FIG. 3B has a decreased power consumption and a greater accuracy in comparison to the conventional merged delta-sigma modulator 200 shown in FIG. 2. That is, the weighted sum to the second adder of the conventional merged delta-sigma modulator 200 is eight. Specifically, the gain from the third scaled feed forward path 216 is one, the gain from each of the second scaled feed forward path 214 and the third scaled feed forward path 216 is three and the gain from the fourth scaled feed forward path 218 is one. Therefore, the weighted sum to the second adder 210 is eight. Accordingly, because the weighted sum is eight, the feedback factor of the third integrator 208 of the conventional merged delta-sigma modulator 200 is approximately ⅛.

Furthermore, the weighted sum to the second adder of the delta-sigma modulator 300 shown in FIG. 3 is five. Specifically, the gain from the first scaled feed forward path 212 is one, the gain from the second scaled feed forward path 214 is three, and the gain from the third scaled feed forward path 216 is one. Therefore, the weighted sum to the second adder 210 is five. Accordingly, because the weighted sum is five, the feedback factor of the third integrator 208 of the delta-sigma modulator 300 is approximately ⅕. Consequently, because ⅕ is greater than ⅛, the delta-sigma modulator 300 has a decreased power consumption and a greater accuracy in comparison to the conventional merged delta-sigma modulator 200.

It should be noted that the delta-sigma modulator 300 may further include a digital to analog converter receives an output from the quantizer 220 (not shown). The digital to analog converter may output a signal to the first adder 202.

Figure 4A:
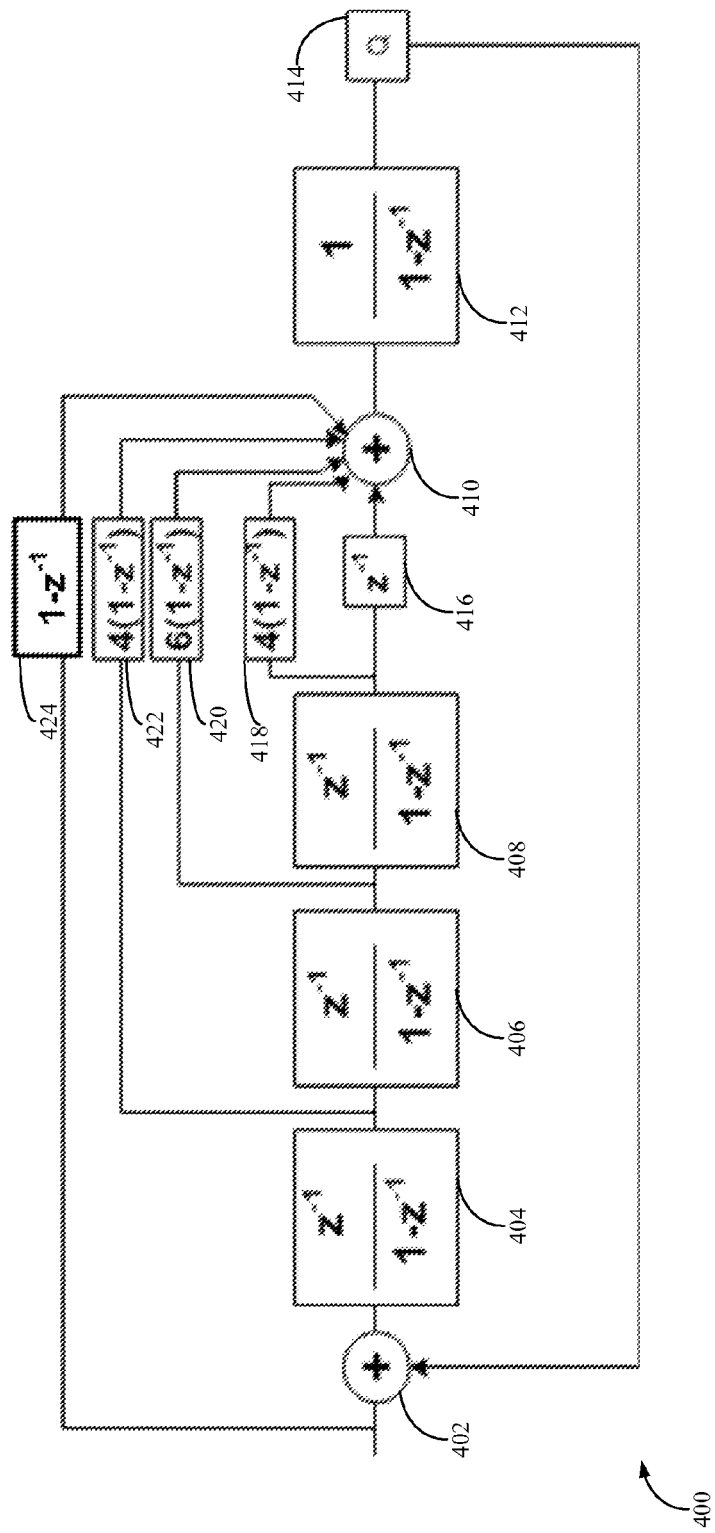
FIG. 4A illustrates a feed-forward delta-sigma modulator according to aspects of the present disclosure.

FIG. 4A illustrates an example of a fourth order merged delta-sigma modulator 400 using a feed-forward low distortion architecture, according to an aspect of the present disclosure. As illustrated in FIG. 4A, the fourth order merged delta-sigma modulator 400 includes a first adder 402, a first integrator 404, a second integrator 406, a third integrator 408, a fourth integrator 412, a second adder 410, a quantizer 414, a first scaled feed forward path 416, a second scaled feed forward path 418, a third scaled feed forward path 420, a fourth scaled feed forward path 422, and a fifth scaled feed forward path 424.

Figure 4B:
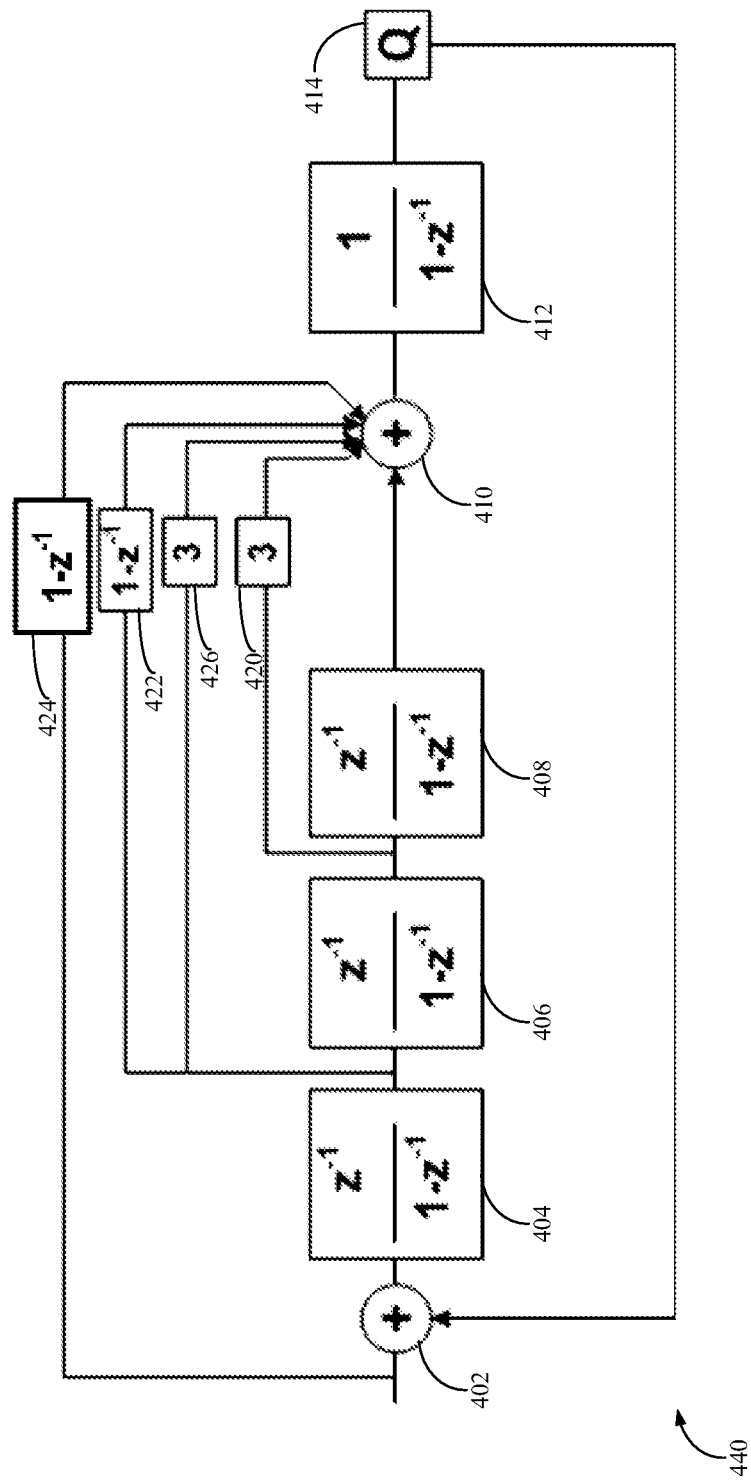
FIG. 4B illustrates a feed-forward delta-sigma modulator according to an aspect of the present disclosure.

FIG. 4B illustrates a fourth order example of a delta-sigma modulator 440 using a feed-forward low distortion architecture, according to an aspect of the present disclosure. The delta-sigma modulator 440 includes elements similar to the fourth order merged delta-sigma modulator 400 of FIG. 4A. Specifically, the delta-sigma modulator 440 includes a first adder 402, a first integrator 404, a second integrator 406, a third integrator 408, a fourth integrator 412, a second adder 410, and a quantizer 414. According to the present aspect, a portion of the second scaled feed forward path 418 is moved to receive an output from a previous integrator and multiplied by the inverse of the transfer function of the previous integrator, resulting in the third scaled feed forward path 420 having a modified amplification/delay. Furthermore, portions of the third scaled feed forward path 420 are moved to receive an output from a previous integrator and multiplied by the inverse of the transfer function of the previous integrator, resulting in a fifth amplifier delay 426. The fifth amplifier delay 426 may be merged with the fourth scaled feed forward path 422 for modifying the amplification and/or delay of the fourth scaled feed forward path 422.

It should be noted that movement of the scaled feed forward path is not fixed and the amount which is moved to receive an output from a previous integrator may be adjusted as desired to decrease the complexity of the delta-sigma modulator. It should be further noted that the delta-sigma modulator 440 may further include a digital to analog converter receives an output from the quantizer 414 (not shown). The digital to analog converter may output a signal to the first adder 402.

Figure 5:
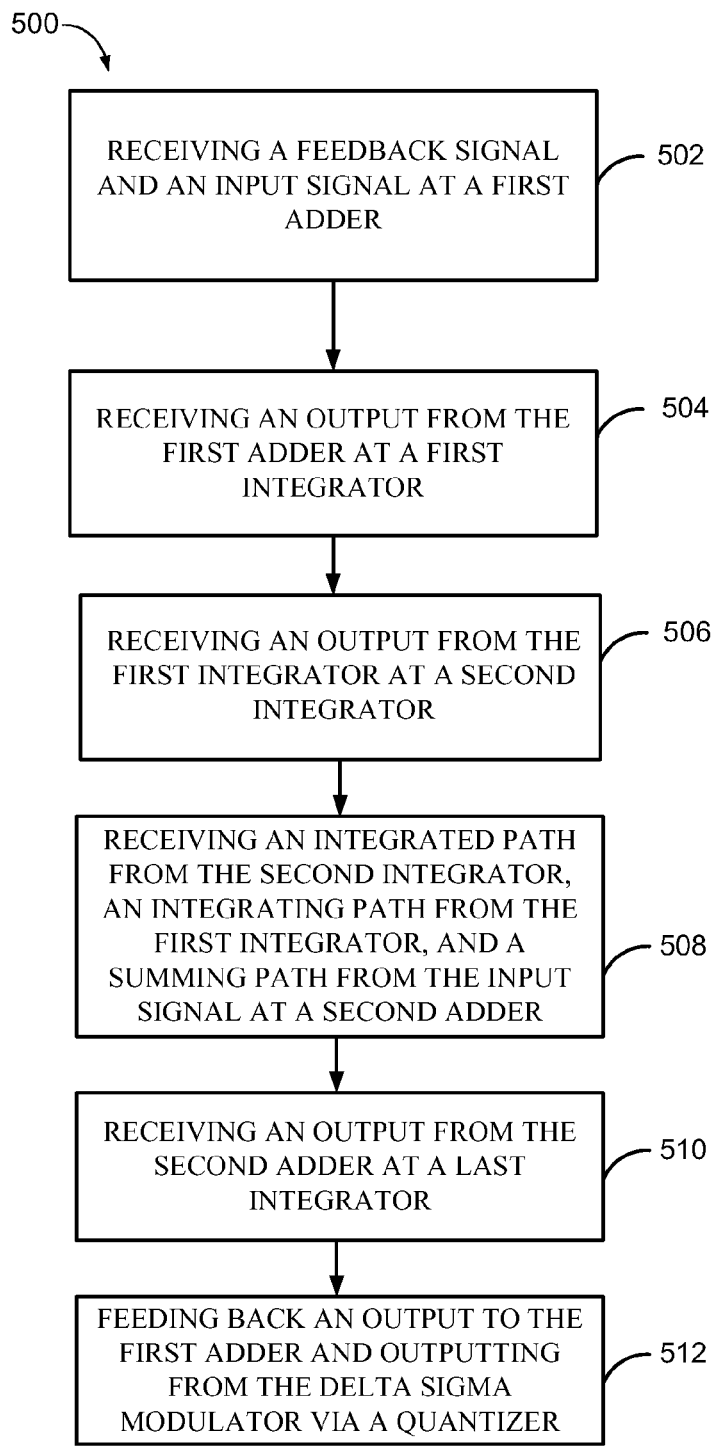
FIG. 5 illustrates a block diagram for a method of implementing a forward delta-sigma modulator according to an aspect of the present disclosure.

FIG. 5 illustrates a block diagram of a method 500 for processing signals in a low distortion feed forward delta sigma modulator according to an aspect of the present disclosure. As illustrated in FIG. 5, in block 502 a feedback signal and an input signal are received at a first adder. In block 504, an output from the first adder is received at a first integrator. Furthermore, at block 506, an output from the first integrator is received at a second integrator. Additionally, an integrated path from the second integrator, an integrating path from the first integrator, and a summing path from the input signal are received at a second adder, in block 508. Moreover, an output from the second adder is received at a last integrator, at block 510. Finally, a quantizer may feed back an output to the first adder and the quantizer may output from the delta sigma modulator, in block 512.

Figure 6:
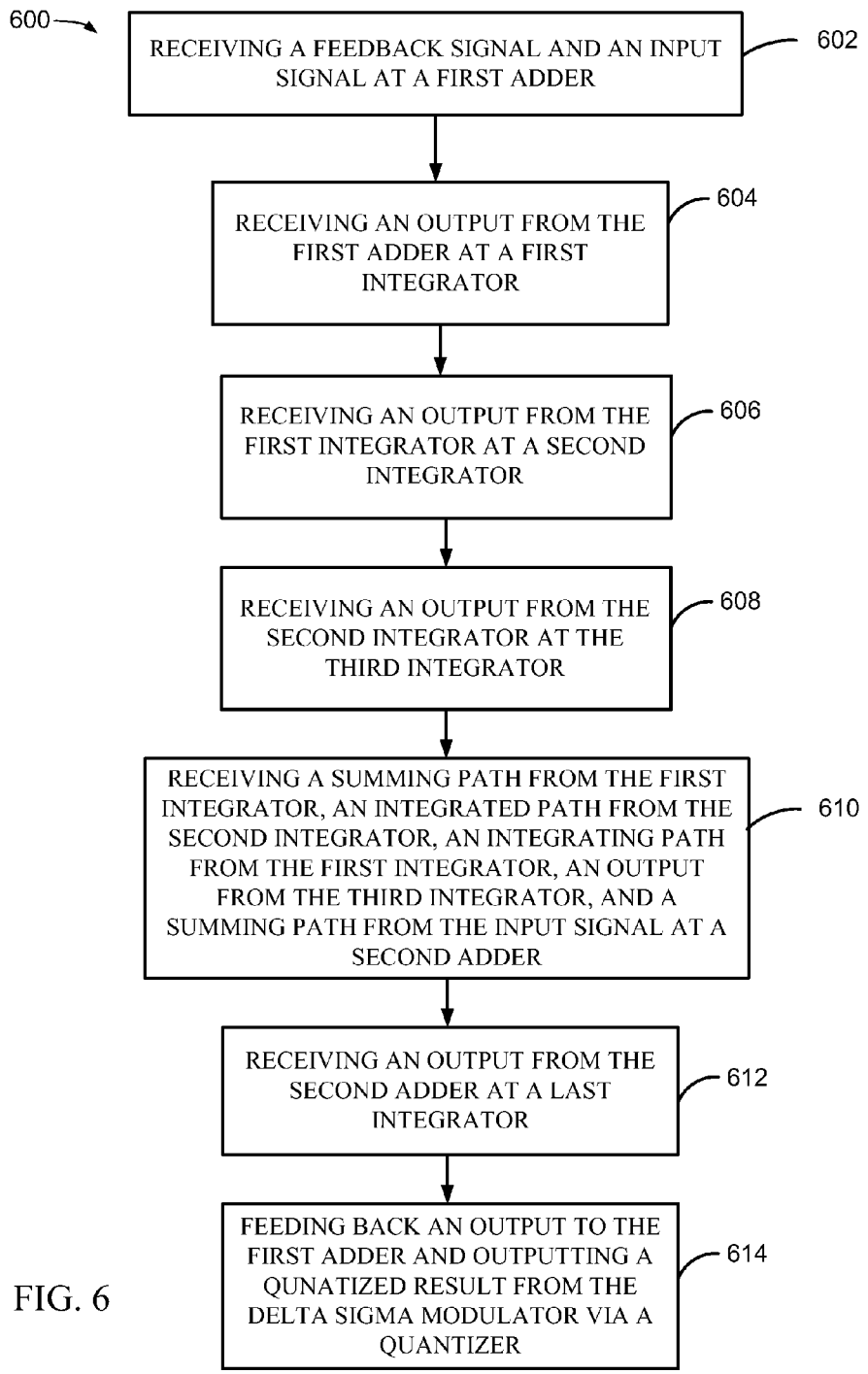
FIG. 6 illustrates a block diagram of a method for processing signals in a low distortion feed forward delta sigma modulator according to another aspect of the present disclosure.

FIG. 6 illustrates a block diagram of a method 600 for processing signals in a low distortion feed forward delta sigma modulator according to another aspect of the present disclosure. As illustrated in FIG. 6, in block 602 a feedback signal and an input signal are received at a first adder. In block 604, an output from the first adder is received at a first integrator. Furthermore, at block 606, an output from the first integrator is received at a second integrator. Moreover, at block 608, an output from the second integrator is received at the third integrator. Additionally, a summing path from the first integrator, an integrated path from the second integrator, an integrating path from the first integrator, an output from the third integrator, and a summing path from the input signal are received at a second adder, in block 610. An output from the second adder is received at a last integrator, at block 612. Finally, a quantizer may feed back an output to the first adder and the quantizer may output a quantized result from the delta sigma modulator, in block 614.

Figure 7:
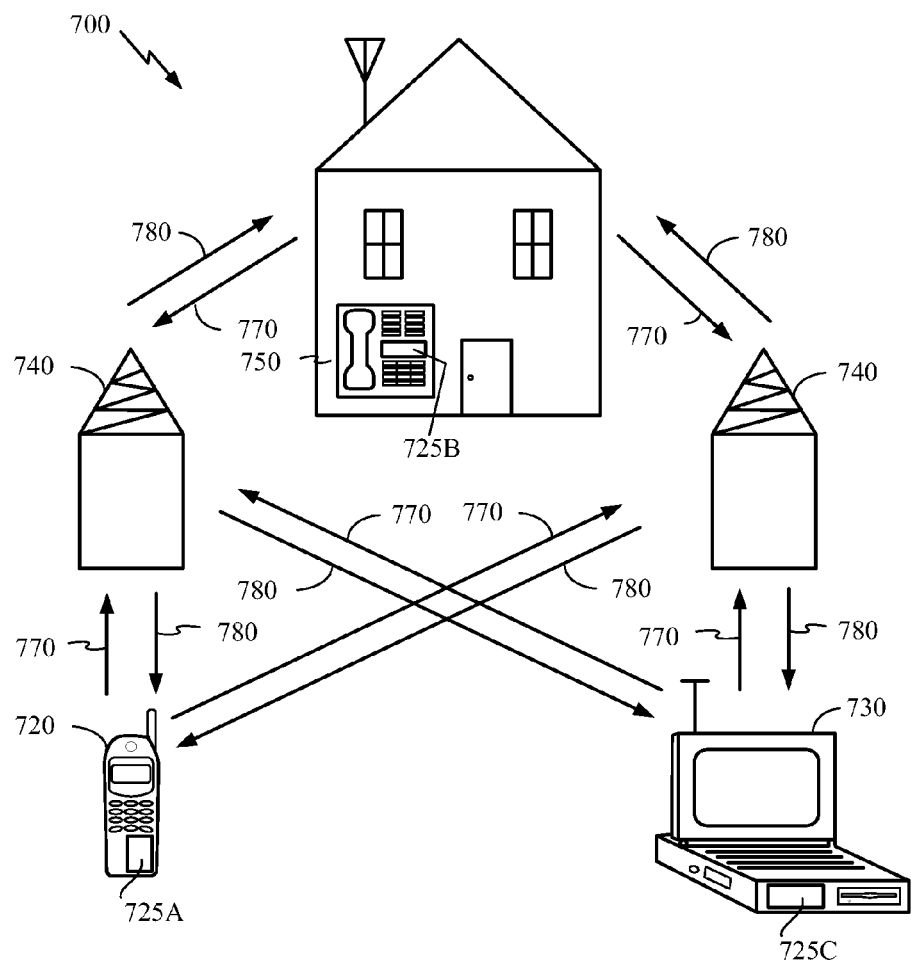
FIG. 7 illustrates an exemplary wireless communication system in which an embodiment of the disclosure may be advantageously employed.

FIG. 7 shows an exemplary wireless communication system 700 in which an embodiment of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include low distortion feed forward delta sigma modulators 725A, 725B, 725C. FIG. 7 shows forward link signals 770 from the base stations 740 and the remote units 720, 730, and 750 and reverse link signals 710 from the remote units 720, 730, and 750 to base stations 740.

In FIG. 7, the remote unit 720 is shown as a mobile telephone, remote unit 730 is shown as a portable computer, and remote unit 750 is shown as a fixed location remote unit in a wireless local loop system. For example, the remote units may be cell phones, hand-held personal communication systems (PCS) units, a set top box, a music player, a video player, an entertainment unit, a navigation device, portable data units, such as personal data assistants, or fixed location data units such as meter reading equipment. Although FIG. 7 illustrates remote units, which may employ low distortion feed forward delta sigma modulators 725A, 725B, 725C according to the teachings of the disclosure, the disclosure is not limited to these exemplary illustrated units. For instance, a low distortion feed forward delta sigma modulator according to aspects of the present disclosure may be suitably employed in any device.

Figure 8:
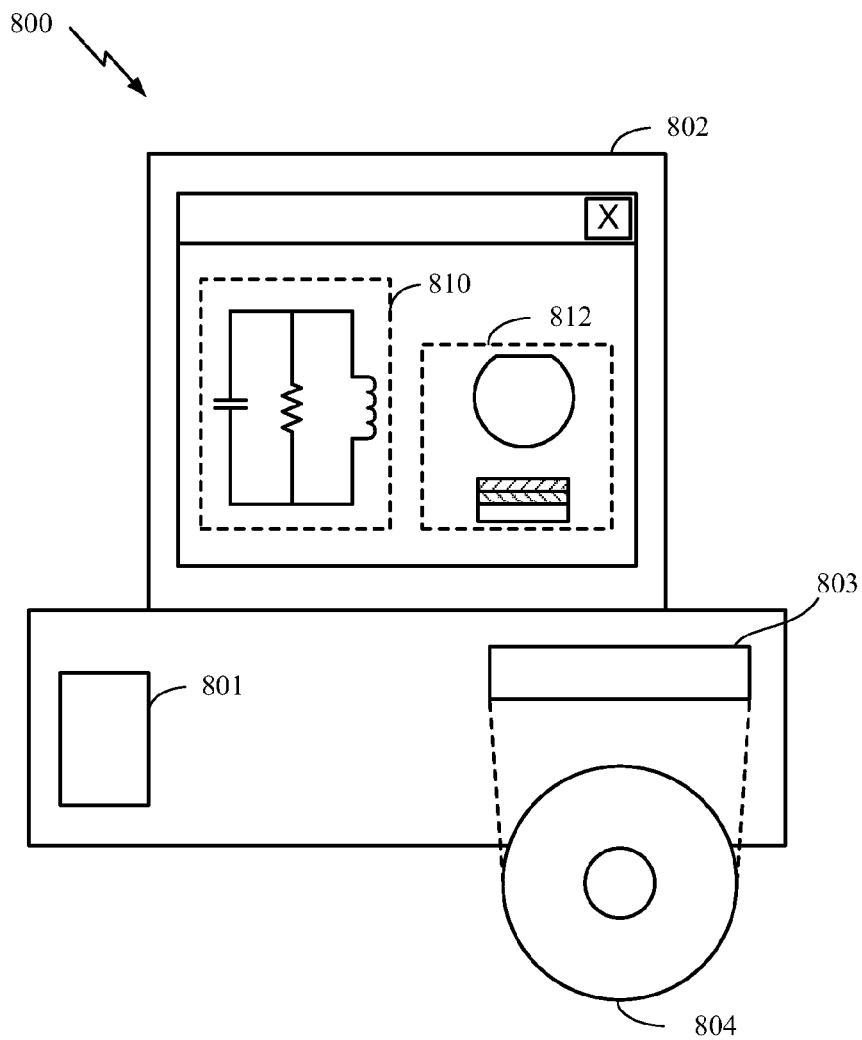
FIG. 8 is a block diagram illustrating a design workstation used for circuit, layout, and logic design of a semiconductor component according to one aspect of the present disclosure.

FIG. 8 is a block diagram illustrating a design workstation used for circuit, layout, and logic design of a semiconductor component, such as the multi-core processor with the low distortion feed forward delta sigma modulator disclosed above. A design workstation 800 includes a hard disk 801 containing operating system software, support files, and design software such as Cadence or OrCAD. The design workstation 800 also includes a display 802 to facilitate design of a circuit 810 or a semiconductor component 812 such as a low distortion feed forward delta sigma modulator. A storage medium 804 is provided for tangibly storing the circuit design 810 or the semiconductor component 812. The circuit design 810 or the semiconductor component 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit design 810 or the semiconductor component 812 by decreasing the number of processes for designing semiconductor wafers.

In one configuration, a low distortion feed forward delta sigma modulator comprises adding means. In one aspect, the adding means may be a first adder 202 and 403 or a second adder 210 and 410 configured to perform the functions recited by the adding means. The low distortion feed forward delta sigma modulator is also configured to include means for integrating. In one aspect, the integrating means may be a first integrator 204 and 404, a second integrator 206 and 406, a third integrator 208 and 408, or a fourth integrator 412 configured to perform the functions recited by the insulating means. The low distortion feed forward delta sigma modulator is also configured to include a means for feeding back. In one aspect, the feeding back means may be a quantizer 220 and 414 configured to perform the functions recited by the quantizing means. In another aspect, the aforementioned means may be any module or any apparatus configured to perform the functions recited by the aforementioned means. Although specific means have been set forth, it will be appreciated by those skilled in the art that not all of the disclosed means are required to practice the disclosed configurations. Moreover, certain well known means have not been described, to maintain focus on the disclosure.

Although specific circuitry has been set forth, it will be appreciated by those skilled in the art that not all of the disclosed circuitry is required to practice the disclosed embodiments. Moreover, certain well known circuits have not been described, to maintain focus on the disclosure.

The methodologies described herein may be implemented by various means depending upon the application. For example, these methodologies may be implemented in hardware, firmware, software, or any combination thereof For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine or computer readable medium tangibly embodying instructions may be used in implementing the methodologies described herein. For example, software code may be stored in a memory and executed by a processor. When executed by the processor, the executing software code generates the operational environment that implements the various methodologies and functionalities of the different aspects of the teachings presented herein. Memory may be implemented within the processor or external to the processor. As used herein, the term "memory" refers to any type of long term, short term, volatile, nonvolatile, or other memory and is not to be limited to any particular type of memory or number of memories, or type of media upon which memory is stored.

The machine or computer readable medium that stores the software code defining the methodologies and functions described herein includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. As used herein, disk and/or disc includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present teachings and their advantages have been described in detail, it should be understood that various changes, substitutions and alterations can be made herein without departing from the technology of the teachings as defined by the appended claims. Moreover, the scope of the present application is not intended to be limited to the particular aspects of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding aspects described herein may be utilized according to the present teachings. Accordingly, the appended claims are intended to include within their scope such processes, machines, manufacture, compositions of matter, means, methods, or steps.

What is claimed is:

1. A low distortion feed forward delta sigma modulator, comprising:
    a first adder operable to receive a feedback signal and an input signal;
    a first integrator operable to receive an output from the first adder;
    a second integrator operable to receive an output from the first integrator;
    a third integrator operable to receive an output from the second integrator;
    a second adder operable to receive a second integrated path from the second integrator, a first integrating path from the first integrator, a first summing path from the input signal, a second summing path from the first integrator, and an output from the third integrator;
    a last integrator operable to receive an output from the second adder; and
    a quantizer operable to feedback output to the first adder and also outputting from the low distortion feed forward delta sigma modulator.

2. The delta sigma modulator of claim 1, further comprising a digital to analog converter operable to receive the output from the quantizer.

3. The delta sigma modulator of claim 1, integrated in a mobile phone, a set top box, a music player, a video player, an entertainment unit, a navigation device, a computer, a hand-held personal communication systems (PCS) unit, a portable data unit, and/or a fixed location data unit.

4. A method for processing signals in a low distortion feed forward delta sigma modulator, the method comprising:
    receiving a feedback signal and an input signal at a first adder;
    receiving an output from the first adder at a first integrator;
    receiving an output from the first integrator at a second integrator;
    receiving an output from the second integrator at a third integrator;
    receiving a second integrated path from the second integrator, a first integrating path from the first integrator, a first summing path from the input signal, a second summing path from the first integrator, and an output from the third integrator at the second adder;
    receiving an output from the second adder at a last integrator; and
    feeding back output to the first adder and outputting from the low distortion feed forward delta sigma modulator via a quantizer.

5. The method of claim 4, further comprising receiving an output of the quantizer at a digital to analog converter.

6. The method of claim 4, further comprising integrating the delta sigma modulator into a mobile phone, a set top box, a music player, a video player, an entertainment unit, a navigation device, a computer, a hand-held personal communication systems (PCS) unit, a portable data unit, and/or a fixed location data unit.

7. A low distortion feed forward delta sigma modulator, comprising:
    first means for adding a feedback signal and an input signal;
    first means for integrating an output from the first means for adding;
    second means for integrating an output from the first integrating means;
    third means for integrating an output from the second means for integrating;
    second means for adding a second integrated path from the second means for integrating, a first integrating path from the first means for integrating,. a first summing path from the input signal, a second summing path from the first means for integrating, and an output from the third means for integrating;
    last means for integrating an output from the second means for adding; and
    means for feeding back an output to the first means for adding and for outputting from the low distortion feed forward delta sigma modulator.

8. The delta sigma modulator of claim 7, further comprising means for digital to analog converting an output from the means for feeding back.

9. The delta sigma modulator of claim 7, integrated in a mobile phone, a set top box, a music player, a video player, an entertainment unit, a navigation device, a computer, a hand-held personal communication systems (PCS) unit, a portable data unit, and/or a fixed location data unit.

10. A method for processing signals in a low distortion feed forward delta sigma modulator, the method comprising:
    the step for receiving a feedback signal and an input signal at a first adder;
    the step for receiving an output from the first adder at a first integrator;
    the step for receiving an output from the first integrator at a second integrator;
    the step for receiving an output from the second integrator at a third integrator;
    the step for receiving a second integrated path from the second integrator, a first integrating path from the first integrator, a first summing path from the input signal, a second summing path from the first integrator, and an output from the third integrator at the second adder;
    the step for receiving an output from the second adder at a last integrator; and
    the step for feeding back output to the first adder and outputting from the low distortion feed forward delta sigma modulator via a quantizer.

11. The method of claim 10, further comprising the step for receiving an output of the quantizer at a digital to analog converter.

12. The method of claim 10, further comprising the step for integrating the delta sigma modulator into a mobile phone, a set top box, a music player, a video player, an entertainment unit, a navigation device, a computer, a hand-held personal communication systems (PCS) unit, a portable data unit, and/or a fixed location data unit.

* * * * *